United States Patent [19]
Itaya et al.

[11] Patent Number: 4,968,951
[45] Date of Patent: Nov. 6, 1990

[54] PHASE LOCKED LOOP HAVING CIRCUIT FOR RECOVERING FROM OSCILLATION STOPPAGE

[75] Inventors: Eiji Itaya, Otawara; Yoshiaki Kumagai, Nishinasunomachi, both of Japan

[73] Assignee: Fujitsu Limited, Kawasaki, Japan

[21] Appl. No.: 443,150

[22] Filed: Nov. 30, 1989

[30] Foreign Application Priority Data

Dec. 20, 1988 [JP] Japan ................................ 63-325023

[51] Int. Cl.[5] .............................................. H03L 7/18
[52] U.S. Cl. ...................................... 331/1 A; 331/16; 331/25
[58] Field of Search ........................... 331/1 A, 16, 25

[56] References Cited
U.S. PATENT DOCUMENTS 4,135,165  1/1979  Coe ................................... 331/16 X Primary Examiner—Siegfried H. Grimm
Attorney, Agent, or Firm—Staas & Halsey

[57] ABSTRACT

A phase locked loop for extracting an output signal synchronized with an input signal. The present invention is structured so that a phase locked loop can prevent loss of control due to high frequency noise generated by a level conversion circuit in the feedback loop after oscillation of the VCO has stopped due to a failure. The phase locked loop includes an exchange circuit connected between an output of the phase detector and an input to the feedback loop. When the exchange circuit determines that the output of the phase detector is below a reference voltage, it applies a signal having a frequency which is lower than that of the input signal to the phase detector in place of a signal from a frequency divider in the feedback loop. In such a case, the phase detector outputs a pulse signal which restarts oscillation of the VCO and leads to normal phase control operation.

8 Claims, 7 Drawing Sheets

PHASE LOCKED LOOP HAVING CIRCUIT FOR RECOVERING FROM OSCILLATION STOPPAGE

BACKGROUND OF THE INVENTION

1. Field of the Invention

The present invention is directed to a phase locked loop for locking the phase of an output signal to an input signal. More particularly, the present invention is directed to a phase locked loop for varying oscillation frequency over a broad range.

A phase locked loop is used, for example, as a local oscillator for a satellite communication apparatus. It is also widely used as a frequency synthesizer and a subcarrier recovery circuit for FM stereo or a television receiver. When a phase locked loop is used as a local oscillator for a satellite communication apparatus, it requires a particularly wide band variable oscillation frequency.

2. Description of the Prior Art

An ordinary phase locked loop (hereinafter referred to as a PLL) is shown in FIG. 1. In FIG. 1, reference numeral 11 designates a phase detector, 12 designates a loop filter, 13 designates a voltage controlled oscillator (hereinafter referred to as a VCO), 14 designates a level conversion circuit, and 15 designates a frequency divider.

Operation of the PLL will be explained hereafter. An input signal and a signal (which is obtained by dividing an output signal of the VCO 13 into 1/N through a feedback loop consisting of a level conversion circuit 14 and a frequency divider 15) are input to the phase detector 11. The phase detector 11 outputs a signal depending on the phase difference of the two inputs. A control voltage of the VCO 13 can be obtained from the signal depending on the phase difference by way of the loop filter 12. Since the oscillation frequency of an output signal of the VCO 13 is controlled by a control voltage, the PLL is controlled to eliminate a phase difference between the input signal and an output signal.

The relationship between the control voltage Vc of the VCO 13 and an oscillation frequency $f_{out}$ of the output signal from the VCO 13 requires a wide band oscillation frequency for the output signal of the VCO 13 as shown in FIG. 2. A graph of an applied voltage (the control voltage) and capacitance variation characteristics of a variable capacitance diode of the VCO 13 is shown in FIG. 3. As shown in FIG. 3, when the applied voltage to the variable capacitance diode is low, its capacitance changes suddenly. That is, since an impedance changes suddenly, there is a high probability that the VCO 13 may stop if the applied voltage is low. If the application frequency is in the range of $f_L$-$f_H$ and the control voltage $V_c$ is in the range of $V_1$-$V_2$ as shown in FIG. 2, oscillation stops at the point where $V_c \leq V_0$. This phenomenon often occurs in a wide band oscillation VCO.

If the control voltage (applied voltage) drops due to some reason and causes the oscillation of the VCO 13 to stop, the following problem occurs in an ordinary PLL. The frequency divider 15 is formed as a digital circuit and therefore it is provided with a circuit, in the feedback loop at the input side, for converting the analog signal from the VCO 13 into a digital signal having a predetermined level. The circuit for this purpose is connected as the level conversion circuit 14 which includes a buffer circuit. Therefore, the frequency divider 15 is connected to receive an AC signal from the VCO 13. The buffer circuit always generates high frequency noise as shown in FIG. 4A since it is an analog circuit. Accordingly, when the PLL operates normally, a problem is not generated. If, however, oscillation of the VCO 13 stops as described above, a problem occurs because the amplitude of the high frequency noise is output as a pulse signal from the frequency divider 15, as shown in FIG. 4B, due to the threshold voltage for distinguishing a high level and a low level. This pulse signal is input to the phase detector 11. Here, the signal input from the frequency divider 15 is a broad band signal having a frequency element higher than the input signal from the input terminal. Intrinsically, if oscillation of the VCO 13 stops, control is carried out to raise the frequency of the output signal for phase matching. However, even when oscillation of the VCO 13 stops, the phase detector 11 determines, due to the effect of the high frequency noise, that the signal from the frequency divider 15 has a frequency higher than that of the input signal. Accordingly, an output signal from the phase detector 11 must be controlled to raise the frequency of the output of the VCO 13 for phase matching. In contrast, an output signal from the phase detector 11 is controlled to lower the oscillation frequency of the output signal of the VCO 13 due to the operations described above. As a result, despite the fact that the control voltage $V_c$ of the VCO 13 becomes equal to or lower than $V_0$ and oscillation stops, control is conducted to lower the frequency of the output signal of the VCO 13. Therefore, the VCO 13 is further maintained in the stop condition and cannot return to the normal operating condition.

The PLL of the prior art which has been designed for solving the above-mentioned problems is shown in FIG. 5. The elements that are like those in FIG. 1 are designated by like reference numerals. Numeral 16 designates an adder to which a voltage $V_B$ is applied to keep the control voltage $V_c$ equal to or higher than the voltage $V_0$. Since the voltage $V_B$ is applied to the output of the loop filter 12 by the adder 16, the control voltage applied to the VCO 13 will never become lower than $V_0$ and therefore the VCO 13 does not stop. Thus, the problems that an ordinary PLL encounters can be eliminated.

However, in the case of the PLL shown in FIG. 5, the voltage $V_B$ output from the adder 16 is supplied from any power supply provided anywhere in the system and therefore the power supply noise is superimposed onto the voltage $V_B$. Particularly, when a large voltage dividing resistor is used, the noise amplitude becomes higher. Accordingly, noise is directly superimposed on the control voltage of the VCO 13 and therefore the output signal of the VCO 13 is greatly influenced even if the noise level is very low for the broad band VCO. In addition, the frequency characteristics of the adder 16 itself influence the parameters of the PLL and thereby it is not a rare case that the PLL characteristics deteriorate. As described above, the loop filter 12 and the VCO 13 cause problems because they are analog circuits and easily receive the influence of noise and frequency characteristics which deteriorate the characteristics of the PLL.

SUMMARY OF THE INVENTION

It is an object of the present invention to provide a PLL which automatically results in reoscillation of the VCO to recover the intrinsic function of the VCO if such abnormal phenomenon such as failure of oscillation occurs.

It is also an object of the present invention to provide a PLL which does not deteriorate when the VCO is reoscillated.

It is a further object of the present invention to provide a highly reliable PLL with only the addition of a simplified circuit.

The PLL of the present invention includes an exchange means connected to a phase detector and a feedback loop. The exchange means receives a detection signal sent from the frequency divider and causes the phase detector to output a signal having a frequency lower than that of an input signal when the phase detector receives a pulse signal corresponding to a phase difference between the input signal and the detection signal from the frequency divider and detects a phase difference larger than that specified.

Moreover, in a preferred embodiment of the PLL according to the present invention, the exchange means has a structure explained hereunder. If a failure occurs in the PLL, the exchange means selects a signal output from the frequency divider as an input to the phase detector and then outputs the signal having the frequency lower than the input signal to the phase detector.

The exchange means includes integral means for integrating and outputting a signal having a pulse width corresponding to the phase difference output from the detection means, comparison means for comparing an output voltage of the output signal from the integral means and a reference voltage and outputting a signal when the output voltage becomes lower than the reference voltage, first output means for outputting a signal for a time period $\tau_1$ when the output signal from the comparison means is received, OR gate means for receiving outputs from the first output means and the comparison means and outputting an OR'd result, and second output means for outputting a signal for a time period $\tau_2$ when the output signal from the OR gate means is received. The exchange means also operates in accordance with an output signal from the second output means.

DESCRIPTION OF THE PREFERRED EMBODIMENTS

Figure 1:
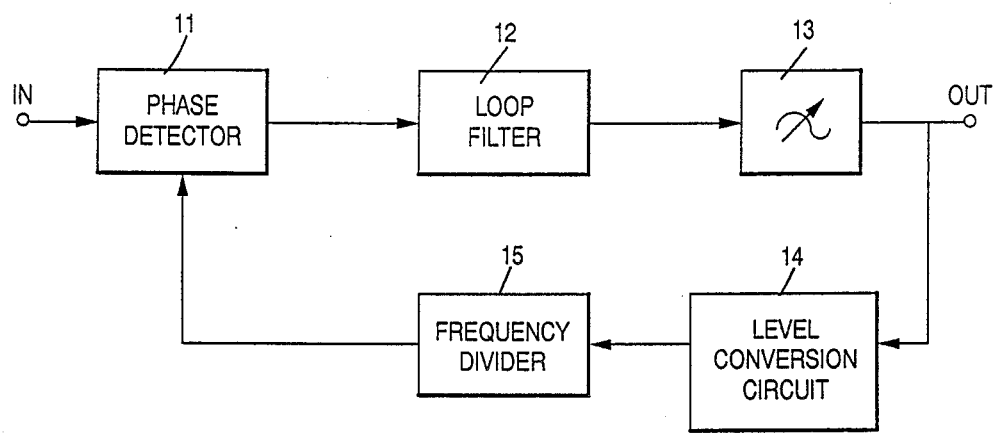
FIG. 1 is a conventional phase locked loop.
Figure 2:
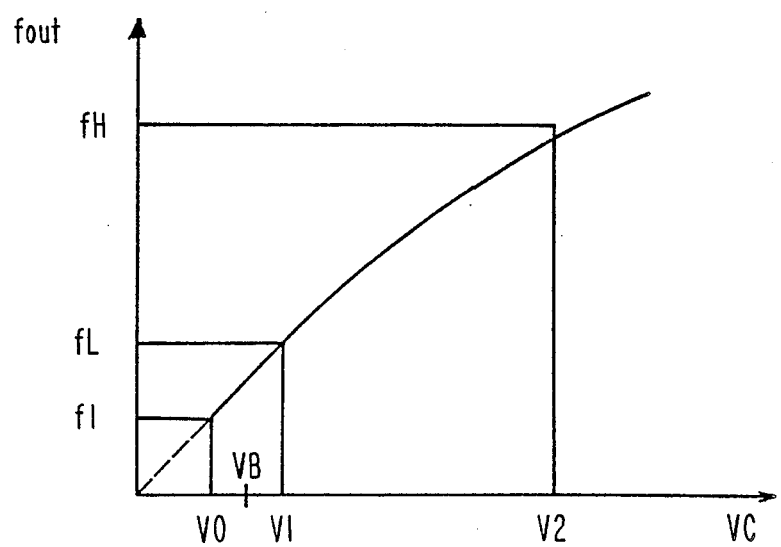
FIG. 2 is a graph of the frequency characteristic of a control voltage input and output voltage of the voltage controlled oscillator of a phase locked loop.
Figures 3, 4A, 4B:
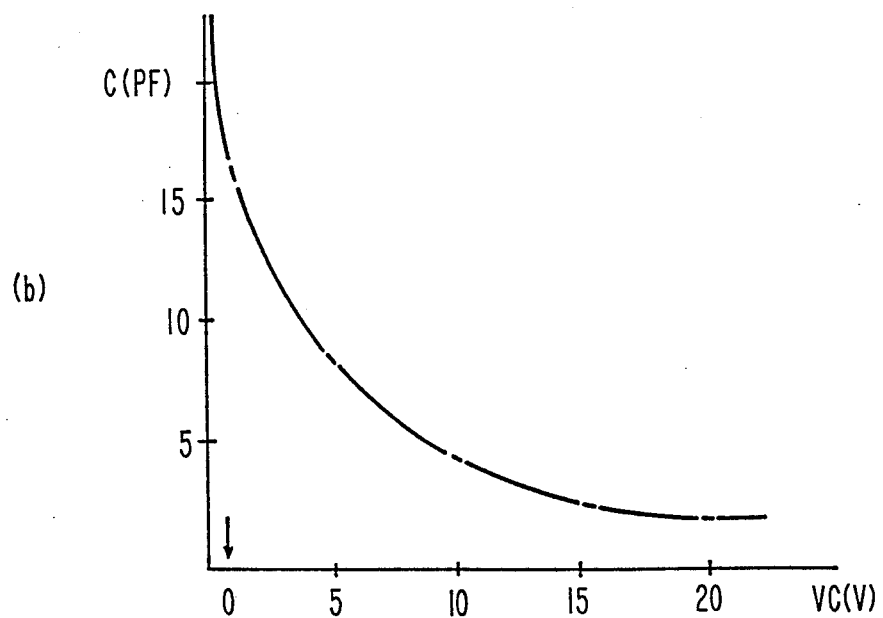
FIG. 3 is a graph of the applied voltage and capacitance characteristics of a variable capacitance diode in a voltage controlled oscillator.
FIGS. 4A and 4B are graphs of waveforms of a power supply noise (FIG. 4A) and a pulse signal output (FIG. 4B) from a frequency divider in a level conversion circuit which includes a buffer circuit and a phase locked loop.
Figure 5:
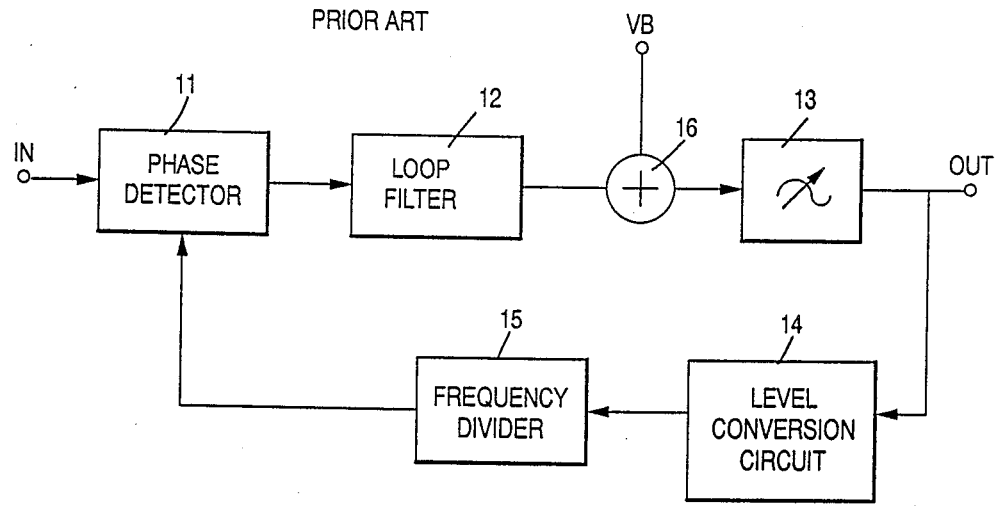
FIG. 5 is a conventional PLL having an adder.
Figure 6:
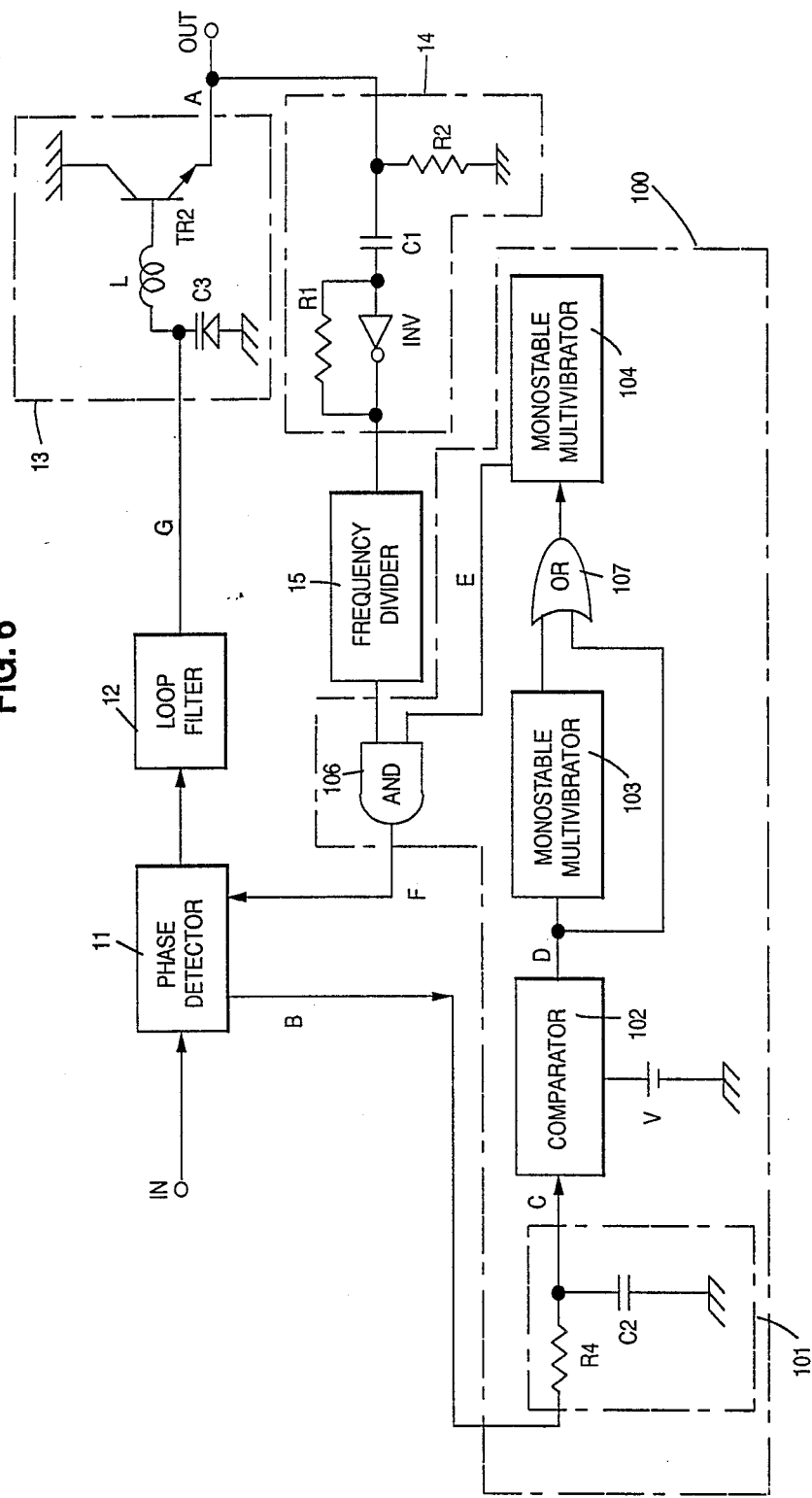
FIG. 6 is a block diagram of a first embodiment of a PLL according to the present invention.

FIG. 6 is a first embodiment of a PLL according to the present invention. In FIG. 6, reference numeral 11 designates a phase detector, reference numeral 12 designates a loop filter, reference numeral 13 designates a voltage controlled oscillator, reference numeral 14 designates a level conversion circuit, reference numeral 15 designates a frequency divider (divider for N frequencies; N=1, 2, ...), reference numeral 100 designates an exchange means comprising an integral circuit 101 including a resistor R4 and a capacitor C2, a comparator 102, a power supply V, a monostable multivibrator 103 having a time constant $\tau_1$, an OR circuit 107, a monostable multivibrator 104 having a time constant $\tau_2$, and an AND circuit 106. Moreover, the VCO 13 includes a variable capacitance diode C3, an inductance L, and a transistor TR2. In addition, the level conversion circuit 14 includes a buffer circuit including a capacitor C1, an inverter INV and a resistor R1, and a termination resistor R2.

Figure 7:
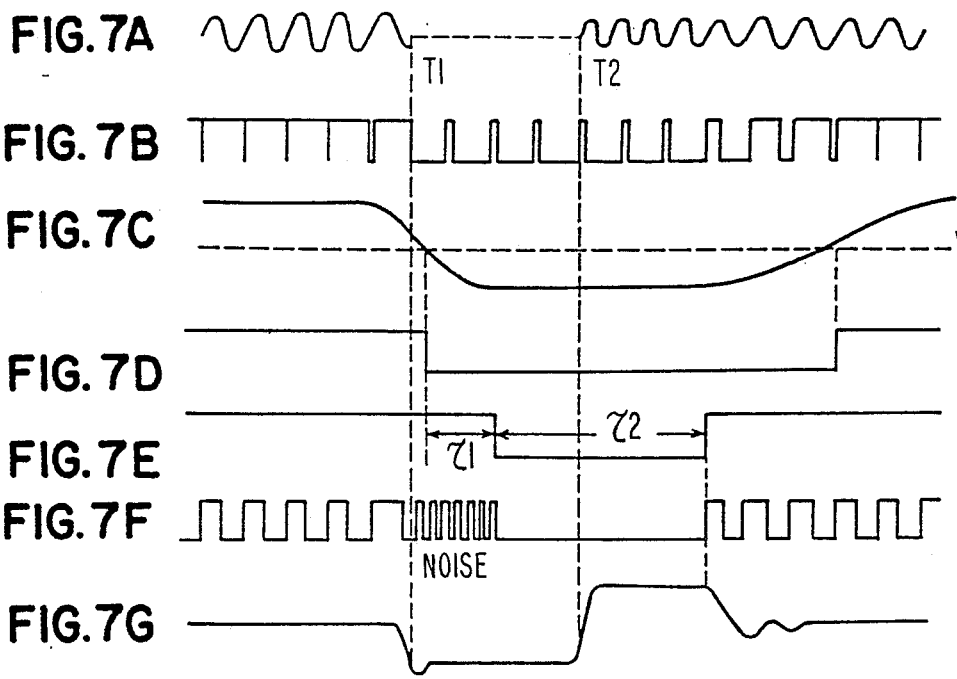
FIGS. 7A–7G are graphs of output waveforms at representative points in FIG. 6.

FIGS. 7A–7B are graphs of output waveforms at representative points in FIG. 6. FIG. 7A is a graph of the output waveforms from the VCO 13. FIG. 7B is a graph of the output waveforms from the phase detector 11. FIG. 7C is a graph of the output waveform from the integral circuit 101. FIG. 7D is a graph of the output waveforms from the comparator 102. FIG. 7E is a graph of the output waveforms from the monostable multivibrator 104. FIG. 7F is a graph of the output waveforms from the AND circuit 106. FIG. 7G is a graph of the output waveforms from the loop filter 12. The dividing ratio of the frequency divider 15 is defined as 1 for simplifying the explanation.

Operations of the embodiment will be explained in detail below. The phase detector 11 conducts a phase comparison between an input signal at an input terminal and an output signal from the VCO 13 appearing through the level conversion circuit 14 and the frequency divider 15. When the PLL operates normally, a high level output from the monostable multivibrator 104 is applied to the AND circuit 106. That is, since the AND circuit 106 is in the ON state, the signal from the frequency divider 15 is output from the AND circuit 16. Moreover, the phase detector 11 outputs a signal having a pulse width corresponding to a phase difference in the signal from the integral circuit 101 and the output signal from the loop filter 12. The integral circuit 101 receives, integrates and outputs the signal having the pulse width corresponding to the phase difference of the signal output from the phase detector 11. The comparator 102, which receives the output signal from the integral circuit 101, compares the reference voltage V with an input signal voltage of the output signal from the integral circuit 101 and outputs a low level signal when failure is detected (for example, generation of asynchronization, particularly when oscillation of the VCO stops) when the input voltage is lower than the reference voltage.

In this case, the reference voltage is determined by defining a failure, through experimentation, for reducing the output voltage of the integral circuit 101. The monostable multivibrator 103 outputs a high level signal for the time period $\tau_1$, which is a protection period, when a signal is input and does not indicate a momentary failure by ORing the input signal to the monostable multivibrator 103 and the output signal thereof. When a signal is input to the monostable multivibrator 104, the monostable multivibrator 104 outputs the low level signal for the time period $\tau_2$ and controls an output of the AND circuit 106 to be a low level. That is, the AND circuit 106 is turned OFF.

As shown in FIG. 7A, an output signal frequency of the VCO 13 becomes low at the time T1 and the pulse width of the output waveform input to the integral circuit 101 from the phase detector 11 is widened. In this case, it also indicates that a phase difference between the two inputs to the phase detector 11 becomes very large. In this case, the control voltage Vc to be input to the VCO 13 becomes lower than the voltage $V_0$ and oscillation stops. Here, the voltage $V_0$ indicates the voltage at which the VCO 13 stops oscillating as described in the Background of the Invention. Therefore, a noise signal generated in the level conversion circuit 14 is also generated by the frequency divider 15 as shown in FIG. 7F.

The operation of the exchange means 100 is explained hereunder. In the case described above, when a signal having a long duration is output from the phase detector 11, an output voltage of the integral circuit 101 becomes lower than the reference voltage V and the comparator 102 Outputs a low level signal as shown in FIG. 7D. The monostable multivibrator 103 and OR circuit 107, which receive a signal output from the comparator 102, confirm a generation of failure for a time longer than the time period $\tau_1$. Upon receipt of signals that verify generation of failure, the OR circuit 107 outputs a low level signal. However, when the voltage of the output signal of the integral circuit 101 becomes higher than the reference voltage within the time period $\tau_1$, the OR circuit 107 does not generate the low level signal. That is, a generation of failure is not recognized in this case. The monostable multivibrator 104, which receives the low level output signal, outputs the low level signal for the time period $\tau_2$ and turns OFF the AND circuit 106. The fact that an output of AND circuit 106 becomes a low level means that the frequency of the signal output from the AND circuit 106 to the phase detector 11 is zero. Therefore, the frequency of the signal output from the AND circuit 106 is judged to be lower than the frequency of the input signal and the phase detector 11 outputs a signal to raise the oscillation frequency of the VCO 13. The output signal from the phase detector 11 sharply raises the output of the loop filter 12 as shown in FIG. 7G. This recovers oscillation of the VCO 13. The AND circuit 106 turns ON again after the time period $\tau_2$ and a signal from the frequency divider 15 is output from the AND circuit 106. As a result, a normal operation of the phase locked loop is carried out. Accordingly, a problem that occurs in the prior art in which the VCO 13 cannot escape from the non-oscillating condition due to a noise signal output from the level conversion 14 is entirely eliminated. Here, in the above embodiment, a low level signal is added, in the asynchronized condition, to the phase detector 11 from the AND circuit 106. However, when this signal is lower in frequency than the input signal from the input terminal, the phase detector 11 outputs a signal to raise the oscillation frequency of the VCO 13. This returns the phase locked loop to normal operation.

Figure 8:
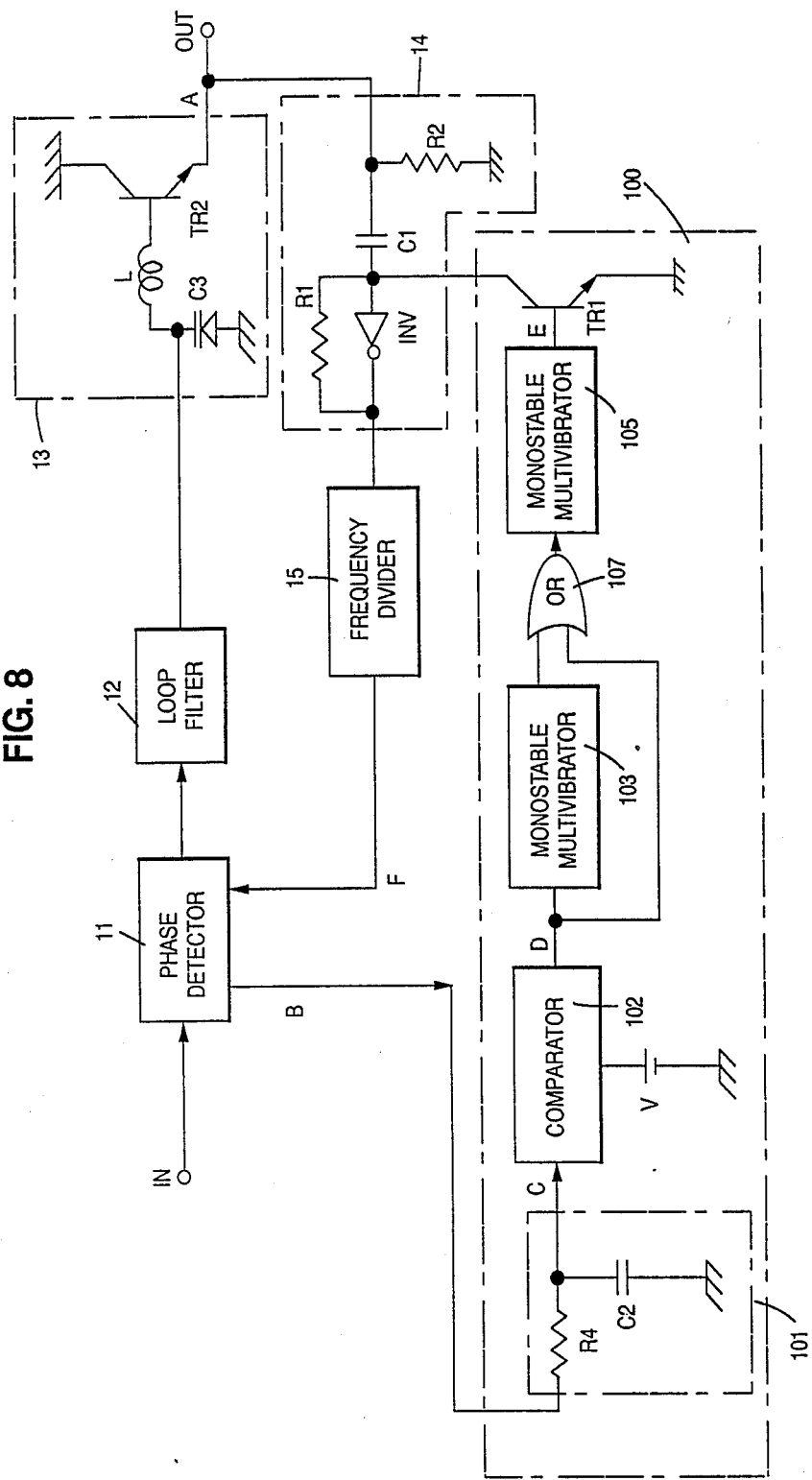
FIG. 8 is a block diagram of a second embodiment of a PLL according to the present invention.

A second embodiment according to the present invention is shown in FIG. 8. The second embodiment will be explained in detail. The elements that are the same as those in the first embodiment are designated by like reference numerals and given like functions. The reference numeral 105 designates a monostable multivibrator having a time constant $\tau_2$ and provides an output signal level inverted from that of the monostable multivibrator 104. TR1 designates a transistor having a collector terminal connected to the input side of the inverter in the level conversion circuit 14, a base terminal connected to the output side of the monostable multivibrator 105 and an emitter terminal connected to ground.

Figure 9A:
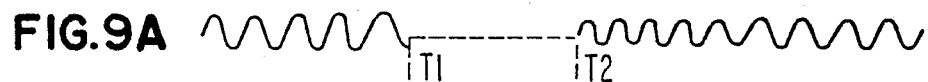
FIGS. 9A–9G are graphs of output waveforms at representative points in FIG. 8.
Figure 9B:
Figure 9C:
Figure 9D:
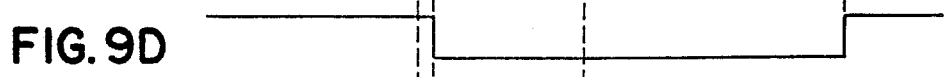
Figure 9E:
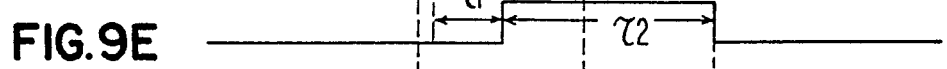
Figure 9F:
Figure 9G:
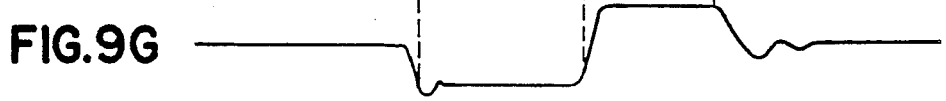

FIGS. 9A–9F are graphs of the output waveforms at representative points in FIG. 8. FIG. 9A is a graph of an output waveform of the voltage controlled oscillator 13. FIG. 9B is a graph of an output waveform to the exchange means 100 from the phase detector 11. FIG. 9C is a graph of an output waveform from the integral circuit 101. FIG. 9D is a graph of an output waveform from the comparator 102. FIG. 9E is a graph of an output waveform from the monostable multivibrator 105. FIG. 9F is a graph of an output waveform from the frequency divider 15. FIG. 9G is a graph of an output waveform from the loop filter 12. The dividing ratio of the frequency divider 15 is defined as 1 for simplifying the explanation.

The operation of FIG. 6 is explained hereunder. During normal operation of the PLL, the transistor TR1 is in the OFF state since the output of the monostable multivibrator 105 is a low level. Like the first embodiment, the input signal is asynchronized to the signal from the frequency divider 15 at the time T1. The phase difference becomes very large and oscillation of the VCO 13 stops. Moreover, the level conversion circuit 14 generates a noise signal and a noise pulse is input to the phase detector 11 as shown in FIG. 9F.

An output voltage of the integral circuit 101 becomes lower than the reference voltage and a low level signal is output from the comparator 102 as shown in FIG. 9D. The input of the low level signal into the monostable multivibrator 105 results in a high level signal being output from the monostable multivibrator 105 after the time period $\tau_1$. This signal turns ON the transistor TR1. Thereby, the input of the inverter INV is grounded, the transistor TR1 turns ON, generation of the noise signal stops simultaneously, and an output of the level conversion circuit 14 is controlled to a fixed high level. Accordingly, an output of the frequency divider 15 is fixed to either a high or low level. The high or low level is determined by an output level of the frequency divider 15 when the high level signal of the level conversion circuit 14 is received. Therefore, the frequency divider 15 outputs a DC element signal, e.g., a signal having 0 Hz frequency. The signal from the frequency divider 15 is determined to have a lower frequency than the input signal. An output from the phase detector 11 raises the oscillation frequency of the VCO 13. The output from the phase detector 11 sharply raises the output from the loop filter 12 as shown in FIG. 9G. Thereby, oscillation of the VCO 13 starts again. After the time period $\tau_2$, the transistor TR1 turns OFF again, the level conversion circuit 14 returns to the normal operating condition and the frequency divider 15 outputs a pulse signal corresponding to the output signal of the VCO 13. Accordingly, normal operation of the PLL is carried out.

In the above-mentioned embodiments of the present invention, a signal having a frequency lower than that of the input signal is applied to the phase detector 11 when a failure condition such as stoppage of oscillation of the VCO 13 occurs, the VCO 13 oscillates again and synchronization of the PLL is carried out. A highly reliable PLL can be provided by adding such a simplified circuit.

The foregoing is considered as illustrative only of the principles of the invention. Further, since numerous modifications and changes will readily occur to those skilled in the art it is not desired to limit the invention to the exact construction and application shown and described, and accordingly, all suitable modifications and equivalents may be resorted to, falling within the scope of the invention and the appended claims and their equivalents.

What is claimed is:

1. A phase locked loop for extracting an output signal synchronized with an input signal input on an input terminal, said phase-locked loop comprising:
    detection means, operatively connected to the input terminal of the phase locked loop, for receiving and comparing the phase of an input signal on the input terminal with that of a signal corresponding to an output signal and outputting a signal corresponding to the phase difference;
    filter means, operatively connected to said detection means, for outputting a control voltage corresponding to the output signal from said detection means;
    oscillation means, operatively connected to said filter means and to an output terminal, for outputting a signal having a frequency corresponding to the control voltage from said filter means;
    conversion means, operatively connected to said oscillation means, for receiving and converting the level of the output signal from said oscillation means;
    division means, operatively connected to said conversion means, for receiving the output signal from said conversion means, dividing the frequency of the output signal by a factor of 1/N, where N is an integer greater than or equal to 1, and outputting the divided signal to said detection means; and
    exchange means, operatively connected to said detection means and said division means, for producing a signal having a frequency lower than the frequency of the input signal at the input terminal to said detection means in place of the output signal of said division means when a phase difference exceeding a predetermined level is detected in said detection means.

2. A phase locked loop according to claim 1, wherein said detection means includes means for outputting a signal having a pulse duration in accordance with the phase difference between the input signal at the input terminal and the divided signal output from said division means.

3. A phase locked loop according to claim 2, wherein said exchange means includes:
    integral means, operatively connected to an output of said detection means, for integrating and outputting a signal having an output voltage and a pulse duration corresponding to the phase difference from said detection means;
    comparison means, operatively connected to said integral means, for comparing the output voltage of the output signal from said integral means with a predetermined reference voltage and outputting a signal when the output voltage is lower than the reference voltage;
    first output means, operatively connected to said comparison means, for outputting a signal when the output signal from said comparison means is continuously input for a period of time longer than a protection period $\tau_1$ for recognizing that asynchronization occurs;
    second output means, operatively connected to said first output means, for outputting a low level signal for a time period $\tau_2$ sufficient to restart normal operation of said oscillation means when the output signal from said first output means is input; and
    an AND gate, operatively connected to said division means and said second output means, for receiving respective output signals from said division means and said second output means and outputting an AND output signal.

4. A phase locked loop according to claim 2, wherein said conversion means includes:
    buffer means including:
        condenser means for receiving the output signal from said oscillation means;
        inverter means connected in series with said condenser means; and
        resistor means connected in parallel with said inverter means; and
    terminating resistance means connected to a connecting point of an output terminal of said oscillation means and an input terminal of said condenser means.

5. A phase locked loop according to claim 4, wherein said exchange means includes:
    integral means, operatively connected to an output of said detection means, for outputting a signal having a voltage and having a pulse duration corresponding to the phase difference from said detection means;
    comparison means, operatively connected to said integral means, for comparing the voltage of the output signal from said integral means with a predetermined reference voltage and outputting a signal when the output voltage is lower than the reference voltage;
    first output means, operatively connected to said comparison means, for outputting a signal when an output signal from said comparison means is continuously received for a period of time exceeding a protection time period $\tau_1$ for reliably recognizing asynchronization;
    second output means, operatively connected to said first output means, for outputting a signal having a low level for a time period $\tau_2$ for restarting normal operation of said oscillation means when the output signal from said first output means is received; and
    switching means, operatively connected between an input terminal of said inverter means and said second output means, for grounding the input terminal of said inverter means.

6. A phase locked loop according to claim 5, wherein said switching means includes a transistor circuit having a collector terminal connected to the input terminal of said inverter means, having a base terminal connected to an output terminal of said second output means and having an emitter terminal connected to ground.

7. A phase locked loop according to claim 3, wherein said first output means comprises:
    a monostable multivibrator; and
    an OR gate operatively connected to said monostable multivibrator; and
    wherein said second output means comprises a monostable multivibrator.

8. A phase locked loop according to claim 5, wherein said first output means comprises:

a monostable multivibrator; and an OR gate operatively connected to said monostable multivibrator; and wherein said second output means comprises a monostable multivibrator.

* * * * *